United States Patent
Srinivasan et al.

(10) Patent No.: US 7,524,015 B2
(45) Date of Patent: Apr. 28, 2009

(54) METHOD OF PRINTING SMOOTH MICRO-SCALE FEATURES

(75) Inventors: Uma Srinivasan, Mountain View, CA (US); Stephen David White, Santa Clara, CA (US); Eric J. Shrader, Belmont, CA (US); Steven E. Ready, Mountain View, CA (US); Scott Jong Ho Limb, Palo Alto, CA (US)

(73) Assignee: Palo Alto Research Center Incorporated, Palo Alto, CA (US)

( * ) Notice: Subject to any disclaimer, the term of this patent is extended or adjusted under 35 U.S.C. 154(b) by 369 days.

(21) Appl. No.: 11/642,146

(22) Filed: Dec. 20, 2006

(65) Prior Publication Data

US 2008/0150989 A1 Jun. 26, 2008

(51) Int. Cl.
B41J 29/393 (2006.01)

(52) U.S. Cl. .......................... 347/19; 438/706

(58) Field of Classification Search .......... 347/2, 347/40, 41, 19; 438/706, 719, 763, 710, 438/714, 723, 725
See application file for complete search history.

(56) References Cited

U.S. PATENT DOCUMENTS

| 5,843,847 A * | 12/1998 | Pu et al. ............... 438/723 |
| 6,247,787 B1 | 6/2001 | Giere et al. |
| 6,503,831 B2 * | 1/2003 | Speakman ............. 438/674 |
| 6,532,026 B2 * | 3/2003 | Takahashi et al. ........ 347/41 |
| 6,890,050 B2 | 5/2005 | Ready et al. |
| 6,972,261 B2 | 12/2005 | Wong et al. |

FOREIGN PATENT DOCUMENTS

| JP | 01 261886 A | 10/1989 |
| WO | WO 01/11426 A | 2/2001 |
| WO | WO 2006/076605 A | 7/2006 |

OTHER PUBLICATIONS

European Search Report dated Mar. 27, 2008.
JP 01 261886 Translation.
Gao, Fuquan, Ain A. Sonin, Precise Deposition of Molten Microdrops: The Physics of Digital Microfabrication, Proceedings: Mathematical and Physical Sciences, vol. 444, No. 1922 (Mar. 8, 1994), The Royal Society.
Schiaffino, Stefano and Ain A. Sonin, Molten Droplet Deposition and Soldification at Low Weber Numbers, Phys. Fluids p. 3172, Nov. 1997 American Institute of Physics.
Schiaffino, Stefano and Ain A. Sonin, Formation and Stability of Liquid and Molten Beads on a Solid Surface, J. Fluid Mech. (1997) vol. 343, pp. 95-110, 1997 Cambridge University Press.

* cited by examiner

*Primary Examiner*—Lamson D Nguyen
(74) *Attorney, Agent, or Firm*—Fay Sharpe LLP

(57) ABSTRACT

A method of jet-printing smooth micro-scale features is presented. The desired feature prior to being printed is masked by various decimation filters and the decimation is performed at various pitches. The subsequently printed image is then scanned and analyzed to determine the roughness of the lines. The optimum decimation pitch is determined by the feature that exhibits the least amount of droplet spreading and has the lowest edge roughness. The optimum decimation pitch may also be calculated from the material properties and the dynamics of fluids.

18 Claims, 9 Drawing Sheets

90 C HOTPLATE 5 SEC.

METHOD OF PRINTING SMOOTH MICRO-SCALE FEATURES

BACKGROUND

The exemplary embodiment relates generally to image processing systems and, more particularly, to a method of printing smooth micro-scale features.

By way of background, a printed circuit board, or PCB, is a self-contained module of interconnected electronic components found in devices ranging from common beepers, or pagers, and radios to sophisticated radar and computer systems. The circuits are generally formed by a thin layer of conducting material deposited, or "printed," on the surface of an insulating board known as the substrate. Individual electronic components are placed on the surface of the substrate and soldered to the interconnecting circuits. Contact fingers along one or more edges of the substrate act as connectors to other PCBs or to external electrical devices such as on-off switches. A printed circuit board may have circuits that perform a single function, such as a signal amplifier, or multiple functions.

Two other types of circuit assemblies are related to the printed circuit board. An integrated circuit, sometimes called an IC or microchip, performs similar functions to a printed circuit board except the IC can contain many more circuits and components. The circuits are electrochemically "grown" in place on the surface of a very small chip of silicon. A hybrid circuit, as the name implies, looks like a printed circuit board, but contains some components that are grown onto the surface of the substrate rather than being placed on the surface and soldered.

Ink-jet printing of circuits is an emerging technology that attempts to reduce the costs associated with production by replacing expensive lithographic processes with simple printing operations. By printing a pattern directly on a substrate rather than using the delicate and time-consuming lithography processes used in conventional manufacturing, a printing system can significantly reduce production costs. The printed pattern can either comprise actual features (i.e., elements that will be incorporated into the final circuit, such as the gates and source and drain regions of thin film transistors, signal lines, opto-electronic device components, etc.) or it can be a mask for subsequent semiconductor or printed circuit board processing (e.g., etch, implant, etc.).

Several forms of printing etch masks exist. One example is that of a printed wax pattern used as a copper etch mask for creating PCBs. Another example is laser direct imaging (LDI), a maskless lithography method that is currently being used for copper etch masks on PCBs. It uses a laser to write the raster image of the pattern directly on the photoresist. In order for it to be to be cost-effective, it is necessary to have special high speed resists. Also, there is no suitable method for soldermask patterning using laser.

Typically, circuit printing involves depositing a print solution (generally an organic material) by raster bitmap along a single axis (the "print travel axis") across a solid substrate (i.e., in the process direction). Print heads, and in particular, the arrangements of the ejectors incorporated in those print heads, are optimized for printing along this print travel axis. Printing of a pattern takes place in a raster fashion, with the print head making "printing passes" across the substrate as the ejector(s) in the print head dispense individual droplets of print material onto the substrate. At the end of each printing pass, the print head position relative to the substrate may be adjusted perpendicular to the print travel axis before beginning a new printing pass. The print head continues making printing passes across the substrate in this manner until the pattern has been fully printed.

Once dispensed from the ejector(s) of the print head, print solution droplets attach themselves to the substrate through a wetting action and proceed to solidify in place, forming printed features consisting of one spot or several connected spots. The size and profile of the deposited material is guided by competing processes of solidification and wetting. In the case of printing phase-change materials, solidification occurs when the printed drop loses its thermal energy to the substrate and reverts to a solid form. In another case, colloidal suspensions such as organic polymers and suspensions of electronic material in a solvent or carrier are printed and wet to the substrate leaving a printed feature. The thermal conditions and material properties of the print solution and substrate, along with the ambient atmospheric conditions, determine the specific rate at which the deposited print solution transforms from a liquid to a solid.

Piezo-electric ink-jet print heads can be used to obtain drops of the order of 20-60 microns. Phase change materials like wax have been used as a masking layer to pattern micro-scale features. Edge scalloping is one of the concerns in the use of jet printing for fabricating IC or other semiconductor fabrication processes. It can result in unreliable print quality and patterning defects leading to inconsistent device performance.

Edge scalloping is undesirable due to the difficulty it presents in defining the electrical performance metrics that are sensitive to edge features, such as electric resistance, electric fields, etc. It is also important to ensure the absence of short circuits that may be caused by edge scalloping in the manufacturing process since it can limit the yield.

Edge scalloping in a printed organic electronics feature may also indicate a potentially serious underlying defect. The electronic behavior of a printed organic electronics feature is affected by its molecular structure. In particular, the molecules of organic printing fluids are typically long chains that need to self assemble in a particular order. However, if a droplet of such printing solution solidifies before an adjacent droplet is deposited; those chains are not allowed to properly assemble, leading to a significant reduction in the electrical continuity or the production in electrically active defects between the two droplets. This, in turn, can severely diminish the performance of the device that incorporates the printed feature. It is therefore essential to have a method of printing adjacent drops that will promote consistent electrical properties.

The physical properties of the printed drops on the substrate govern the drop coalescence and therefore on the quality of the printed features. When a molten drop at temperature $T_o$ is ejected from the print head onto the substrate, the solidification time is given by $$\tau_1 = \frac{2a^2 k}{3\alpha k_a}\left(\ln\left(\frac{T_o - T_a}{T_f - T_a}\right) + \left(1 + \frac{k_s}{2k}\right)\frac{L}{c(T_f - T_a)}\right)$$

where $T_a$ is the ambient temperature, $T_f$ is the fusion temperature, $\alpha$ and $k$ are the thermal diffusivity and the thermal conductivity, respectively of the molten drop and $k_s$ is the thermal conductivity of the substrate, L is the latent heat of fusion and c is the specific heat of the molten drop.

It takes additional time for the drop to cool down to the ambient temperature and the time scale for this process is given by:

$$\tau_2 = \frac{2.3a^2k}{3ak_a}$$

The dynamics of the drop spreading on the substrate is primarily governed by the Weber number $W_e$ and the Ohnesorge number Z:

$$W_e = \frac{\rho V^2 a}{\sigma}$$

$$Z = \frac{\mu}{\sqrt{\rho \sigma a}}$$

where $\mu$ is viscosity, $\rho$ is density, $\sigma$ is surface tension, V is impact velocity and a is the radius of the drop.

The Weber number $W_e$ scales the driving force for the drop spreading and the Ohnesorge number Z scales the force that resists the spreading. While impact and capillarity are the main forces for drop spreading, inertia and viscosity are the main factors that resist the drop spreading.

The time scales of the drop spreading and solidification indicate that the bulk of the drop solidifies only after the spreading is complete. However, local solidification of the drop occurs prior to the completion of the drop spreading and this determines the shape of the printed drop. The local solidification occurs at the contact line between the drop and the substrate and arrests further spreading of the drop.

When drops are ejected at a frequency f, the time between subsequent drops reaching the substrate is $$\tau = \frac{1}{f}$$

and the distance between the centers of the subsequent drops on the substrate is $$l = \frac{u}{f}.$$

Drop coalescence between adjacent drops occur when $l \leq 2a$ and $\tau \leq \tau_1$.

Coalescence between adjacent drops causes lines to be formed from repetitively-deposited circular drops. Generally, substrate temperature can be increased to increase droplet spreading and promote coalescence. Typically in the case for printed wax, maintaining a substrate temperature of 30-40 degrees centigrade improves the smoothness of the printed lines. It is important that the temperature of the substrate remain lower than the freezing point of the wax so that the droplet rapidly freezes on contact with the substrate. Drop spreading on the substrate can cause widening of the printed lines. Print solutions may be engineered to have appropriately high surface tensions which can beneficially prevent the adjacent and overlapping droplet from spreading on the substrate surface, thus minimizing the lateral spreading of the droplets.

Accordingly, at least one challenge in ink-jet printing is to obtain smooth micro-scale lines in spite of the fact that the spots have circular footprints. Thus, there is a need for an improved method for printing smooth micro-scale features.

INCORPORATION BY REFERENCE

The following references, the disclosures of which are incorporated herein in their entireties by reference, are mentioned:

U.S. Pat. No. 6,972,261, issued Dec. 6, 2005 to Wong et al., entitled "METHOD FOR FABRICATING FINE FEATURES BY JET-PRINTING AND SURFACE TREATMENT," describes a method of forming smaller features by jet-printing with materials from aqueous or non-aqueous organic solutions.

U.S. Pat. No. 6,890,050, issued May 10, 2005 to Ready et al., entitled "METHOD FOR THE PRINTING OF HOMOGENEOUS ELECTRONIC MATERIAL WITH A MULTI-EJECTOR PRINT HEAD," describes a system and method for accurately printing IC patterns and allows the printed features to be optimized for edge profile and electrical continuity.

BRIEF DESCRIPTION

A method of jet-printing smooth micro-scale features is presented. The desired feature prior to being printed is masked by various decimation filters and the decimation is performed at various pitches. The subsequently printed image is then scanned and analyzed to determine the roughness of the lines. The optimum decimation pitch is determined by the feature that exhibits the least amount of droplet spreading and has the lowest edge roughness. The optimum decimation pitch may also be calculated from the material properties and the dynamics of fluids.

In accordance with an aspect of the exemplary embodiment, a method of forming smooth micro-scale features with printed spots on a substrate using a printing system having a printing process direction and one or more print heads with one or more ejectors on each print head is presented. The method comprises: determining spot placement pitch and the radius of the printed spots; creating a test pattern; printing the test pattern with the printing system; and analyzing the printed test pattern for drop spreading and smoothness of edges.

In accordance with another aspect of the exemplary embodiment, a storage medium storing a set of program instructions executable on a data processing device and usable to form smooth micro-scale features with printed spots on a substrate using a printing system having a printing process direction and one or more print heads with one or more ejectors on each print head is provided. The set of program instructions comprises: instructions for determining spot placement pitch and the radius of the printed spots; instructions for creating a test pattern; instructions for printing the test pattern with the printing system; and instructions for analyzing the printed test pattern for smoothness of lines.

DETAILED DESCRIPTION

Figure 1:
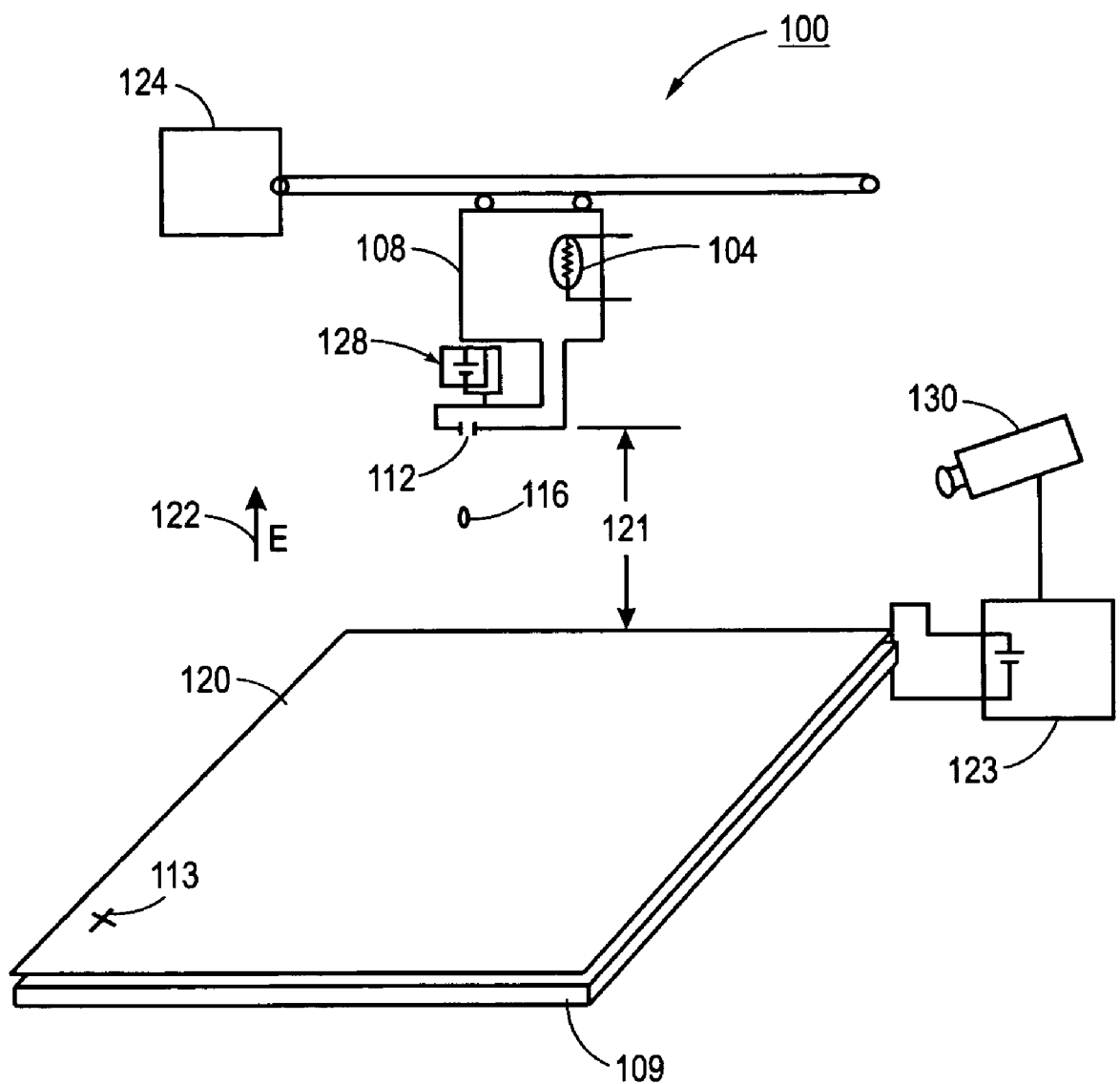
FIG. 1 is a perspective view showing a printing system suitable for implementing aspects of the exemplary embodiment.

Some portions of the detailed description that follows are presented in terms of algorithms and symbolic representations of operations on data bits performed by conventional computer components, including a central processing unit (CPU), memory storage devices for the CPU, and connected display devices. These algorithmic descriptions and representations are the means used by those skilled in the data processing arts to most effectively convey the substance of their work to others skilled in the art. An algorithm is generally perceived as a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be understood, however, that all of these and similar terms are to be associated with the appropriate physical quantities and are merely convenient labels applied to these quantities. Unless specifically stated otherwise as apparent from the following discussion, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

The exemplary embodiment also relates to an apparatus for performing the operations discussed herein. This apparatus may be specially constructed for the required purposes, or it may comprise a general-purpose computer selectively activated or reconfigured by a computer program stored in the computer. Such a computer program may be stored in a computer readable storage medium, such as, but is not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, and each coupled to a computer system bus.

The algorithms and displays presented herein are not inherently related to any particular computer or other apparatus. Various general-purpose systems may be used with programs in accordance with the teachings herein, or it may prove convenient to construct more specialized apparatus to perform the methods described herein. The structure for a variety of these systems will be apparent from the description below. In addition, the exemplary embodiment is not described with reference to any particular programming language. It will be appreciated that a variety of programming languages may be used to implement the teachings of the exemplary embodiment as described herein.

A machine-readable medium includes any mechanism for storing or transmitting information in a form readable by a machine (e.g., a computer). For instance, a machine-readable medium includes read only memory ("ROM"); random access memory ("RAM"); magnetic disk storage media; optical storage media; flash memory devices; and electrical, optical, acoustical or other form of propagated signals (e.g., carrier waves, infrared signals, digital signals, etc.), just to mention a few examples.

In describing the exemplary embodiments, the term "data" refers herein to physical signals that indicate or include information. In this case, "image," as a pattern of physical light or a collection of data representing the physical light, may include characters, words, and text as well as other features such as graphics and circuit layouts. An operation performs "image processing" when it operates on an item of data that relates to a part or all of an image.

An image may be a high addressability image if even only a single pixel of the image is formatted, sampled or produced in one of many known scenarios, all of which may apply to various embodiments. A high addressability pixel can be a pixel comprising a plurality of high addressability pixel events, where, for example, each of the high addressability pixel events corresponds to a specific spatial placement of the writing spot with respect to the pixel and has a value that represents a property of the writing spot at that specific spatial placement. In binary high addressability pixels, for example, each high addressability pixel event is a single bit indicating whether the writing spot is "on" or "off" at the corresponding spatial placement.

High addressability also commonly refers to an imaging method where the imaging device can position the writing spot with precision significantly finer than the size of the writing spot. For instance, a typical high addressability system may operate with a 40 µm writing spot, an addressability of 600 DPI in the direction perpendicular to the raster lines, and an addressability of 4800 DPI in the direction of the raster lines.

High addressability also refers to writing an image with a higher sampling resolution than is input to the writing system. Similarly, high addressability also refers to a pixel sampling resolution that is higher than the input resolution in at least one dimension. For example, an input resolution of 300 spi may be converted to 600 spi and that resolution conversion is referred to as high addressability.

Systems that write high addressability images typically regulate a laser or similar writing device using clock modulation, amplitude modulation, pulse width modulation, pulse width position modulation or equivalent procedures. Imaging devices other than laser scanners can also employ high addressability. For instance, ink jet devices can have drop ejection rates that yield spot placements at high addressability and LED image bars can clock the LED "on" events at rates that are high relative to the spot size and diode spacing.

One or more of the features of the exemplary embodiments described herein may be applied to any digital image, including, for example, a high addressability image.

In the following detailed description a method and system of jet-printing smooth micro-scale features on a substrate using printed patterns will be described. Note that while the embodiments disclosed herein are described with respect to circuit printing for explanatory purposes, these embodiments can be applied to any situation in which high resolution features, resulting from an imaging system, are required.

FIG. 1 shows a system 100 including a heat source 104 that heats a reservoir 108 of the material to be deposited, typically but not limited to phase-change material to a temperature that is sufficient to maintain the material in a liquid state. The system 100 is suitable for creating a pattern, typically using printing devices to controllably eject individual droplets to form a patterned electrical element, protective layer or coating over regions of the substrate to define the feature. Regions that were not at one time covered by protective layer will be subject to deposition (or removal) of materials used to form various features. Thus, the lateral feature size may not be limited by droplet size, but instead by how closely droplets can be positioned together without combining to form a joined feature. Generally, the temperature of the reservoir 108 is maintained above 60 degrees C. and in some embodiments, at temperatures above 140 degrees C., a temperature sufficient to liquefy most phase change organics.

The phase-change material may be an organic media that melts at low temperatures. Other desirable characteristics of the phase-change material include that the patterning material is non-reactive with organic and inorganic materials used in typical semiconductor materials processing, and that the phase change material has a high selectivity to etchants. If liquid suspension is used, the substrate material is maintained at a temperature which facilitates the liquid carrier evaporating upon contact with the substrate surface. When liquid suspension is used, the phase change process is directed from liquid to vapor, rather than from liquid to solid.

An additional desirable characteristic of the phase-change patterning material is that the resulting pattern should be robust enough to withstand wet-chemical or dry etching processes. When a dry etching process is used, phase change patterning materials with low-vapor pressures may be used. Wax is an example of a phase-change material with the previously described characteristics. Kemamide 180-based waxes from Xerox Corporation of Stamford Conn. are one example of a suitable wax for use as a phase-change patterning material.

A plurality of droplet sources such as droplet source 112 receives the liquid phase-change marking material from reservoir 108 and outputs droplets 116 for deposition on a substrate 120. The substrate 120 is maintained at a temperature such that the droplet cools rapidly after deposition. A wetting agent or substrate surface treatment may be included on the surface to enhance wetting thereby assuring that sufficient wetting occurs to form a good contact between the patterned marking material and the substrate. The temperature of the system is maintained such that the cooling rate is sufficient to control the behavior of the droplet after contacting the substrate 120 despite the enhanced wetting properties of the surface to be etched.

When increased coalescence between adjacent droplets is required, the substrate temperature can be increased to increase droplet spreading and thereby increase coalescence. When printing lines of Kemamide-based wax from an ink-jet printer, it has been found that increasing the substrate temperature from 30 degrees to 40 degrees centigrade improves the print quality of the pattern. In the case of Kemamide-based waxes, it has been found that excellent results are achieved when the surface is maintained at 40 degrees centigrade, which is about 20 degrees centigrade below the freezing point of the wax. At 40 degrees centigrade, the temperature of the substrate is still low enough that the droplet rapidly "freezes" upon contacting substrate 120.

In order to minimize ejection directionality errors of droplets between the droplet source 112 and substrate 120, an electric field 122 may be applied to accelerate the droplet from the droplet source 112 to the substrate 120. The electric field may be generated by applying a voltage, typically between one to three kilovolts between the droplet source 112 and an electrode or platen 109 under the substrate 120. The electric field minimizes droplet transit time through the space 121 and allows substrate surface temperature to be the primary factor controlling the phase change operation. The additional force on the charged droplets allows them to follow normal electric field lines in the space 121 and improves the directionality of the droplets allowing for improved straight-line features.

After a droplet of marking material is deposited on the substrate 120, the relative positions of the substrate and the droplet source are adjusted to reposition the droplet source over a second position to be patterned. The repositioning operation may be achieved either by moving the droplet source 112, by moving the substrate 120, or both. A control circuit 124 moves the droplet source 112 in a predetermined pattern over the substrate 120 or the substrate under the droplet source. A driver circuit 128 provides energy to the droplet source 112 causing ejection of droplets when the droplet source 112 is positioned over a region of the substrate 120 to be patterned. By coordinating the movement of the droplet source 112 with the timing of droplet source outputs, a pattern can be "printed" on the substrate 120.

As each spot or collection of spots are printed, a feedback system may be used to assure spots of proper size. An imaging system, such as a camera 130 and vision software for feature recognition and analysis may be used to monitor spot size and feature characteristics. When smaller features are to be printed, or the spot size otherwise reduced, a temperature control circuit 123 lowers the temperature of the surface of the substrate 120. The lower temperature increases the quench rate resulting in rapid solidification of the phase change patterning material upon contact with the substrate 120. When larger spot sizes are needed, usually for merging droplets in larger features, the temperature control circuit 123 raises the temperature of the substrate 120. The temperature control circuit 123 may include a heating element thermally coupled to the substrate 120 such that ambient heating of media around the substrate is minimized.

Generally, the phase change material is a solid at temperatures below the solidification temperature of the material, such as approximately 60 degrees centigrade. As such, it may be unnecessary to cool the substrate below room temperature because, as previously described, a sufficiently small droplet cools rapidly when a 20 degree temperature differential is maintained between the freezing point of the phase change material and the substrate temperature. In such cases, the temperature control circuit may merely be a sensor and a heater that raises the substrate slightly above room temperature when larger feature sizes are to be printed.

In order to control and align the movement of the droplet source 112, printed alignment marks, such as a mark 113, patterned from a previous patterned layer may be used to coordinate the next overlying layer. An image processing system such as the previously described camera may be used to capture the orientation of the previous patterned layer. A processing system then adjusts the position of the overlying pattern layer by altering the pattern image data before actual printing of the pattern layer. In this manner, a significant amount of positioning adjustments are accomplished in software and translated to movements of the droplet source 112 relative to the substrate 120.

Each droplet source may be implemented using a variety of technologies including traditional ink-jet technology and the use of sound waves to cause ejection of droplets of patterning material as done in acoustic ink printing systems.

It is known that adjacent droplets ejected onto the substrate 120 in the process direction wet and coalesce until the phase transformation of the drops occurs and printed spots are formed. Continuous printed features can be formed due to this reason. The print head and/or the substrate 120 may be moved to print the adjacent drops in the process direction.

Figure 2:
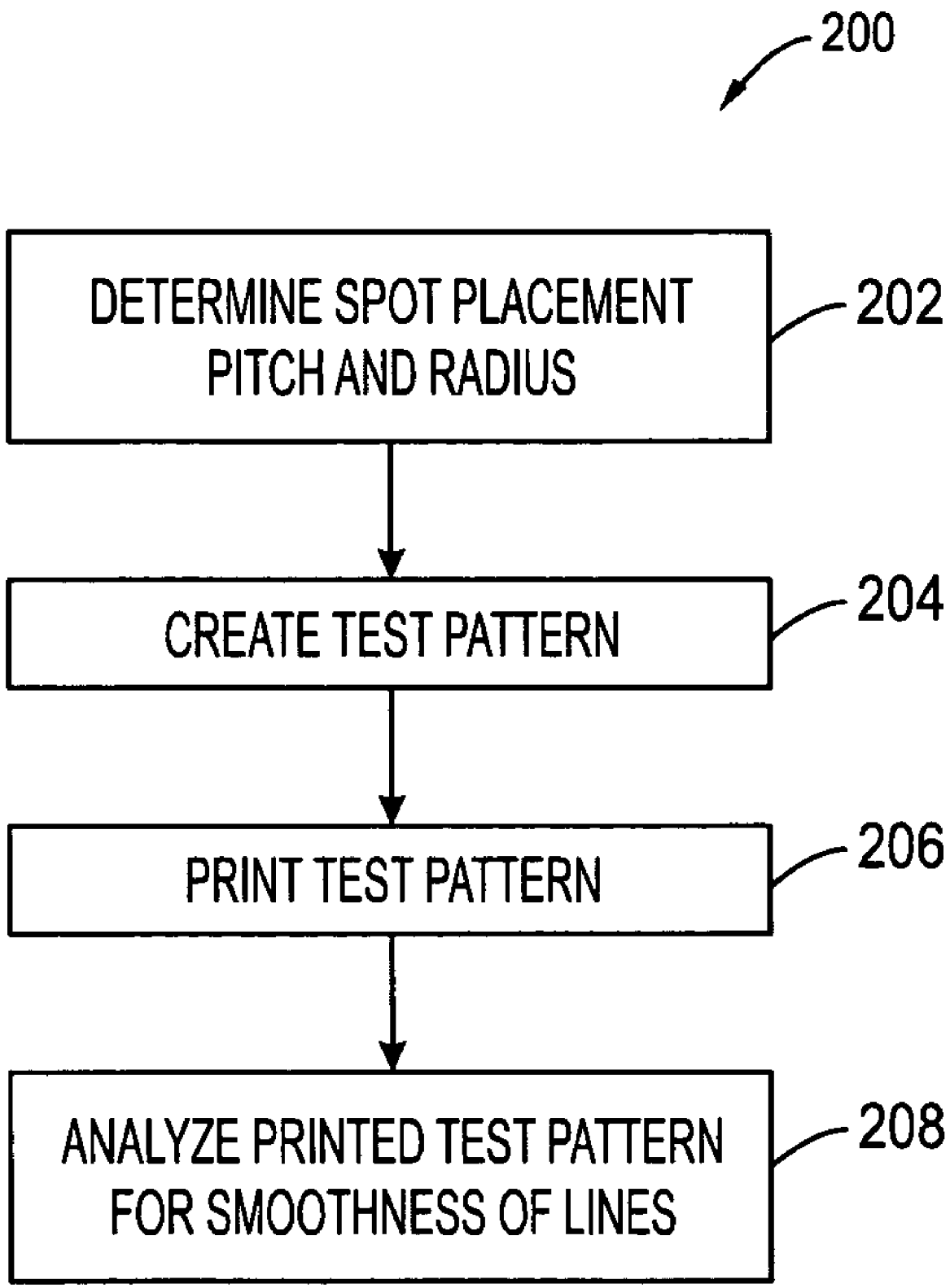
FIG. 2 is a flow chart that describes the operations used to print smooth micro-scale features.

An improved method (200) of printing smooth lines is outlined in the flow chart in FIG. 2. Initially, the spot placement pitch (i.e., the distance between the drop centers) and the radius of the spots are determined (202). However, before determining the spot radius, the print conditions (the substrate temperature, waveform to the piezoelectric ejector, ejecting material, gap between the substrate and the print head) should be made similar to the final desired print. This is important because the radius of the spot will depend on these characteristics.

Next, a test pattern is created (204). The test pattern can consist of successive patterns of spots of varying spot placements demonstrating variations in spot placement pitch and/or adjacent drop timing (see FIG. 8). It may be created using any imaging software like CAD or raster image editing software. The test pattern may also be created by applying decimation filters with varying decimation pitch to the desired features. The test pattern is then printed (206). Finally, the printed test pattern is analyzed by optically checking the roughness and determining the spot placement pitch having the minimum roughness (208).

Figure 3:
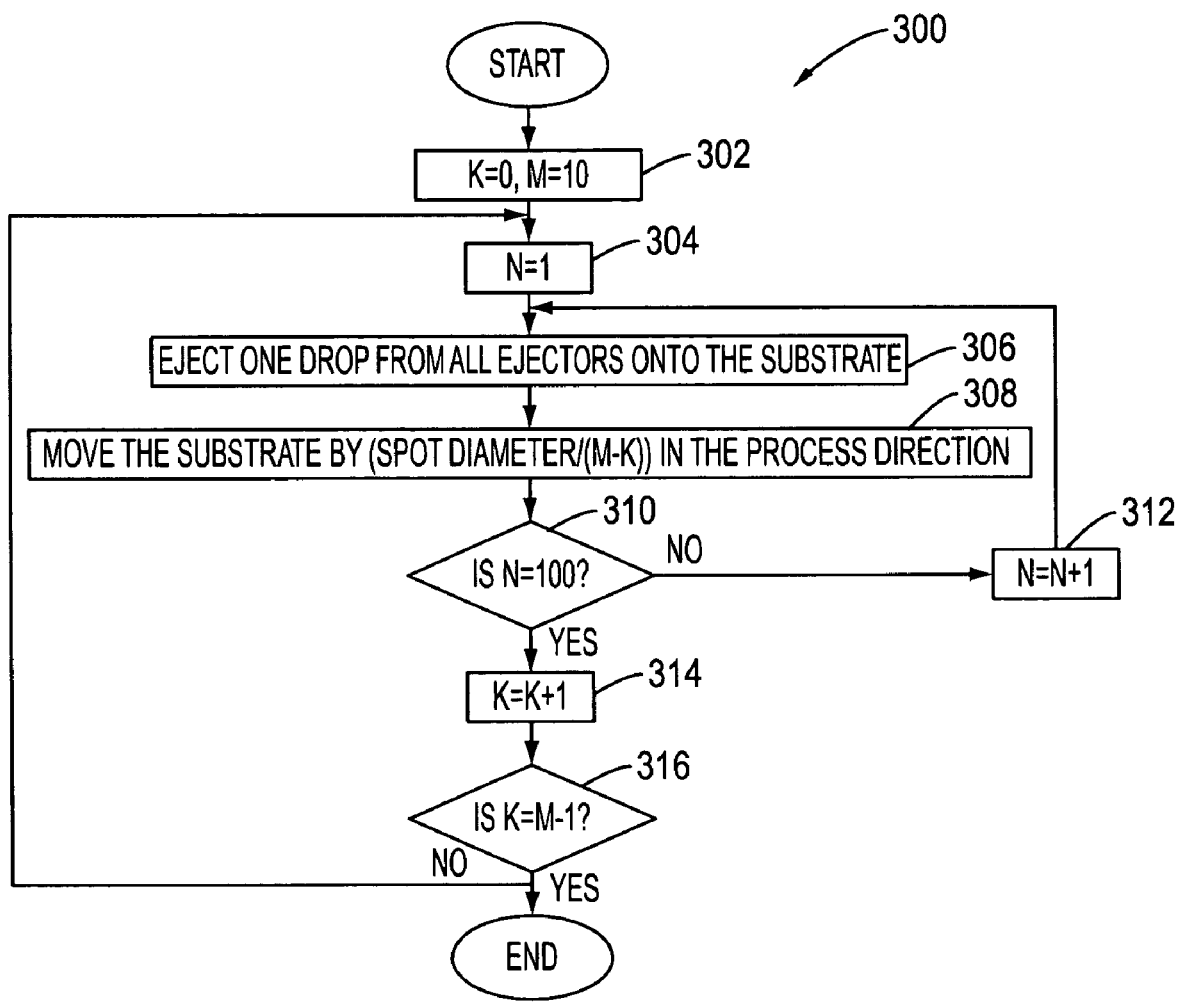
FIG. 3 is a flow chart that describes the operations used to print the test pattern for lines in the process direction (vertical)

FIG. 3 illustrates a method (300) of printing the test pattern for lines in the process direction. The conditions for the test (e.g., speed of printing, material characteristics, waveform to the ejectors, etc.) should be the same as in the actual prints. Initially, the counters K and M are set to 0 and 10, respectively (302). These counters determine the spacing of the spots in the test pattern. Next, the number of spots N that constitute a line is set to 1 (304). At this point, one drop is ejected from all the ejectors onto the substrate 120 (306). The substrate 120 is then moved by a distance equal to $$\frac{SpotDiameter}{M-K}$$

in the process direction (308). A determination is made as to whether N=100 (310). If not, then N is incremented by 1 and the ejection process is repeated (312). Otherwise, K is incremented by 1 (312). A further determination is made as to whether K=M−1 (314). If not, then N is set to 1 and the process is repeated. Otherwise, the process ends. Note that the specific values pertaining to M, N and K may be different than the ones stated in this example.

Figure 4:
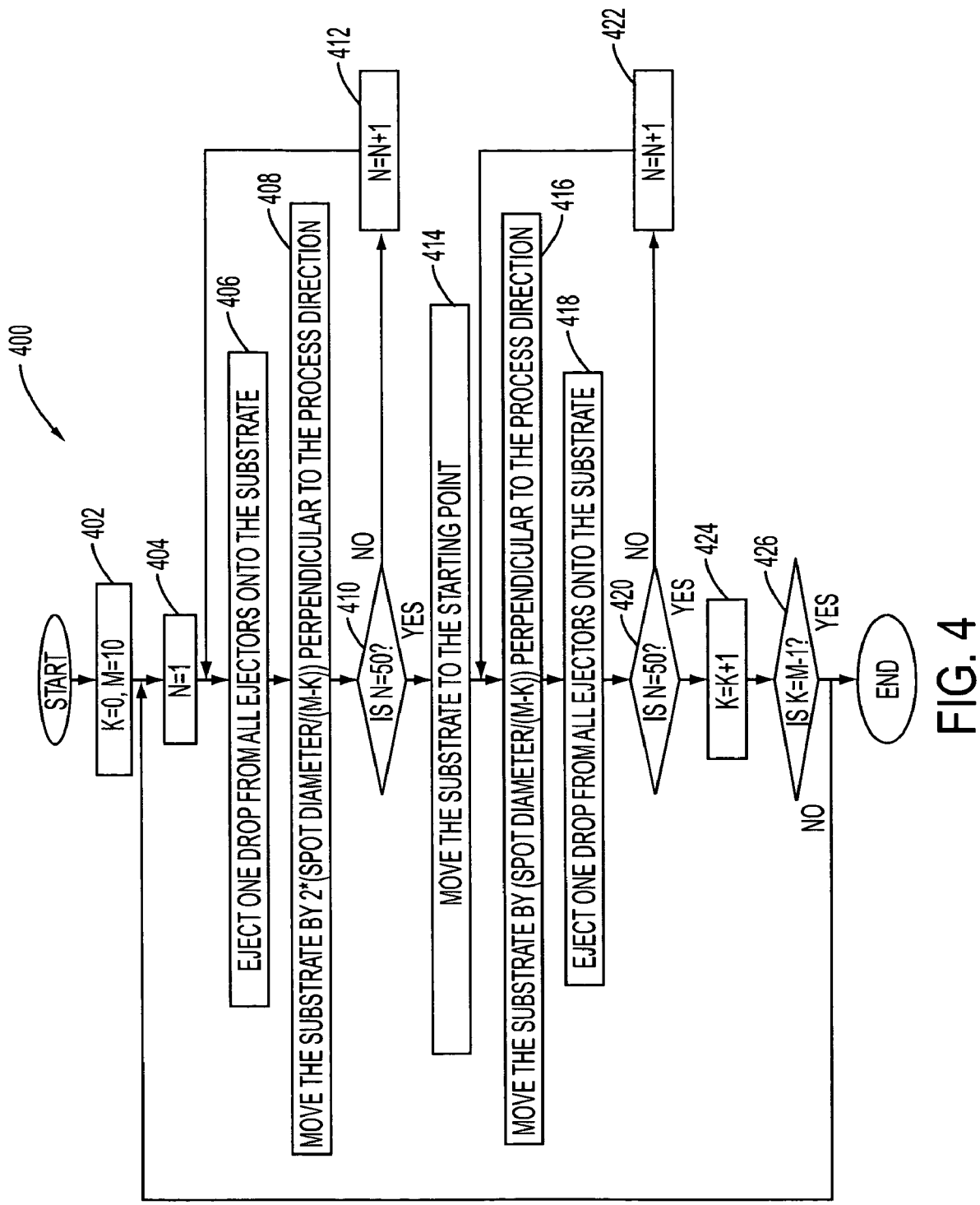
FIG. 4 is a flow chart that describes the operations used to print the test pattern for lines in the cross-process direction (horizontal)

FIG. 4 illustrates a method (400) of printing the test pattern for lines in the cross-process direction. The conditions for the test should be the same as in the actual prints. Initially, K is set to 0, and M is set to 10 (402). Next, N is set to 1 (404). At this point, one drop is ejected from all the ejectors onto the substrate 120 (406). The substrate 120 is then moved by a distance equal to $$2 \times \left(\frac{SpotDiameter}{M-K}\right)$$

perpendicular to the process direction (408). A determination is made as to whether N=50 (410). If not, then N is incremented by 1 and the ejection process is repeated (412). Otherwise, the substrate 120 is first moved to the starting point (414), and then it is moved by a distance equal to $$\frac{SpotDiameter}{M-K}$$

perpendicular to the process direction (416). Once again, one drop is ejected from all the ejectors onto the substrate 120 (418). A determination is made as to whether N=50 (420). If not, then N is incremented by 1 and the substrate 120 is moved again (422). Otherwise, K is incremented by 1 (424), and a determination is made as to whether K=M−1 (426). If not, then the process is repeated. Otherwise, the process ends. Note that the specific values pertaining to M, N and K may be different than the ones stated in this example.

Figure 5:
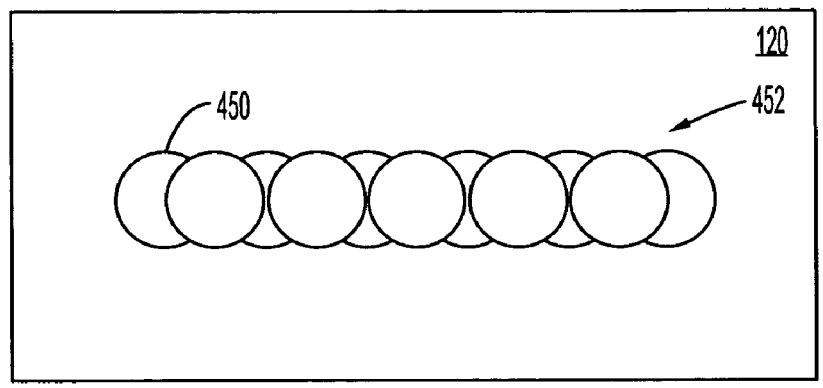
FIG. 5 shows a top view of a number of spots printed on a substrate in the cross-process direction thus forming a line.
Figure 6:
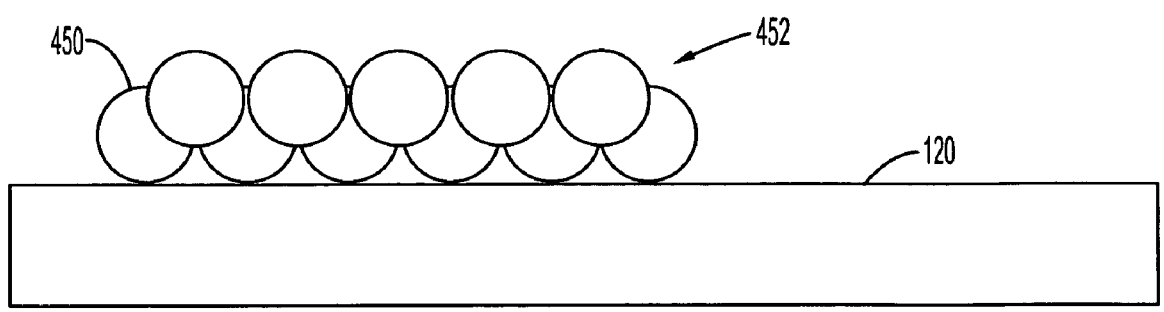
FIG. 6 shows a side view of the printed spots of FIG. 5.

FIG. 5 shows a top view of a number of spots 450 printed on the substrate 120 in the cross-process direction thus forming a line 452, while FIG. 6 shows a side view of the same printed spots 450. It should be noted that this figure is not an accurate representation of the conformity of the droplets as they have frozen onto the surface, but instead is shown to illustrate the layering effect and typical spot placement.

Figure 7:
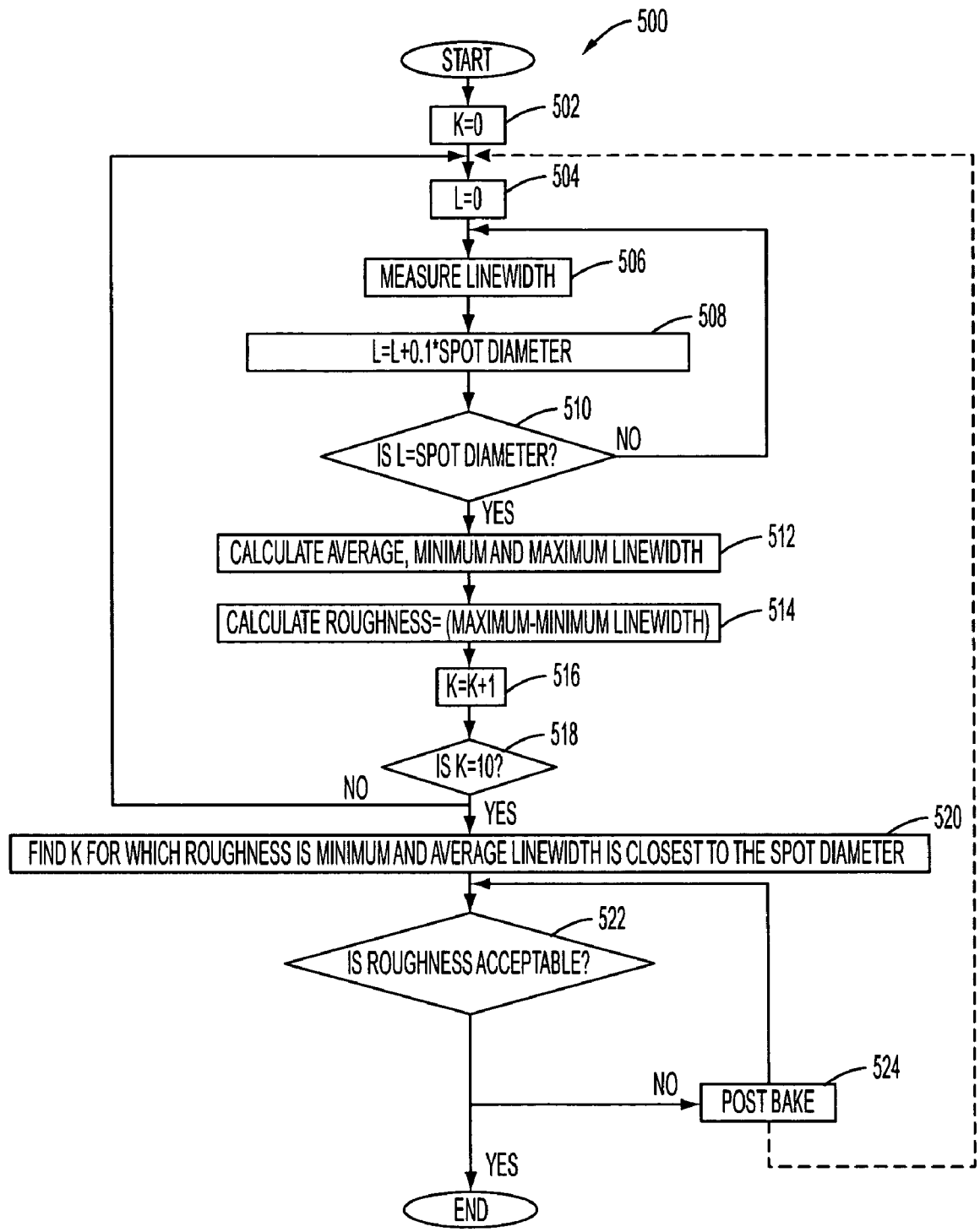
FIG. 7 is a flow chart that describes the operations used to analyze a printed test pattern for smooth lines.

FIG. 7 illustrates a method (500) of analyzing the printed test pattern for smooth lines. Initially, K is set to 0 (502), and L is set to 0 as well (504). The linewidth is then measured (506). The substrate 120 is moved by L=L+0.1*spot diameter (508). In other words, the substrate moves in steps of 0.1*spot diameter.

Next, a determination is made as to whether L=Spot Diameter (510). If not, then the previous two steps are repeated. Otherwise, the average, minimum and maximum linewidths are calculated (512). Next, the roughness is calculated (maximum−minimum linewidth) (514). K is incremented by 1 (516). A determination is then made as to whether K=10 (518). If not, then the process is repeated, starting with setting L to 0 (520). Otherwise, it is necessary to find K for which the roughness is at minimum and the average linewidth is closest to the spot diameter (522). Next, a determination is made as to whether the roughness is acceptable according to predetermined standards (524). If not, then the substrate is post baked (526), as described below, and a further determination is made as to whether the roughness is acceptable. Otherwise, the process is ended and the optimum decimation pitch is determined. Optionally, the entire process may be repeated, starting with setting L to 0. Note that the specific values pertaining to K and L may be different than the ones stated in this example.

Figure 8:
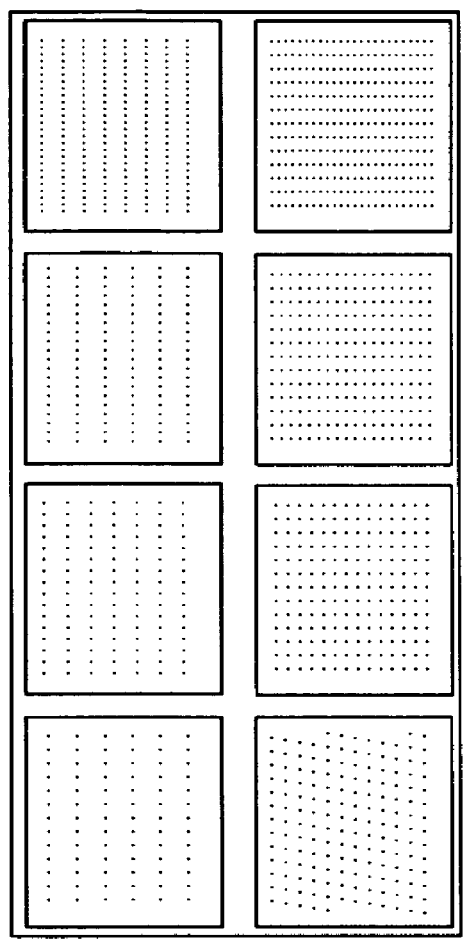
FIG. 8 shows a portion of a printing and analyzing test pattern.
Figure 9:
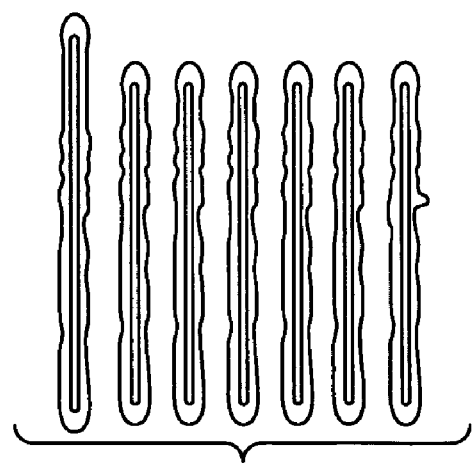
FIG. 9 shows a representation of the printed image obtained from the upper-left pattern of FIG. 8 printed in accordance with aspects of the exemplary embodiment.

A portion of the printing and analyzing test pattern is shown in FIG. 8. A representation of the printed image obtained from the pattern at the upper-left of FIG. 8 is shown in FIG. 9.

Figure 10:
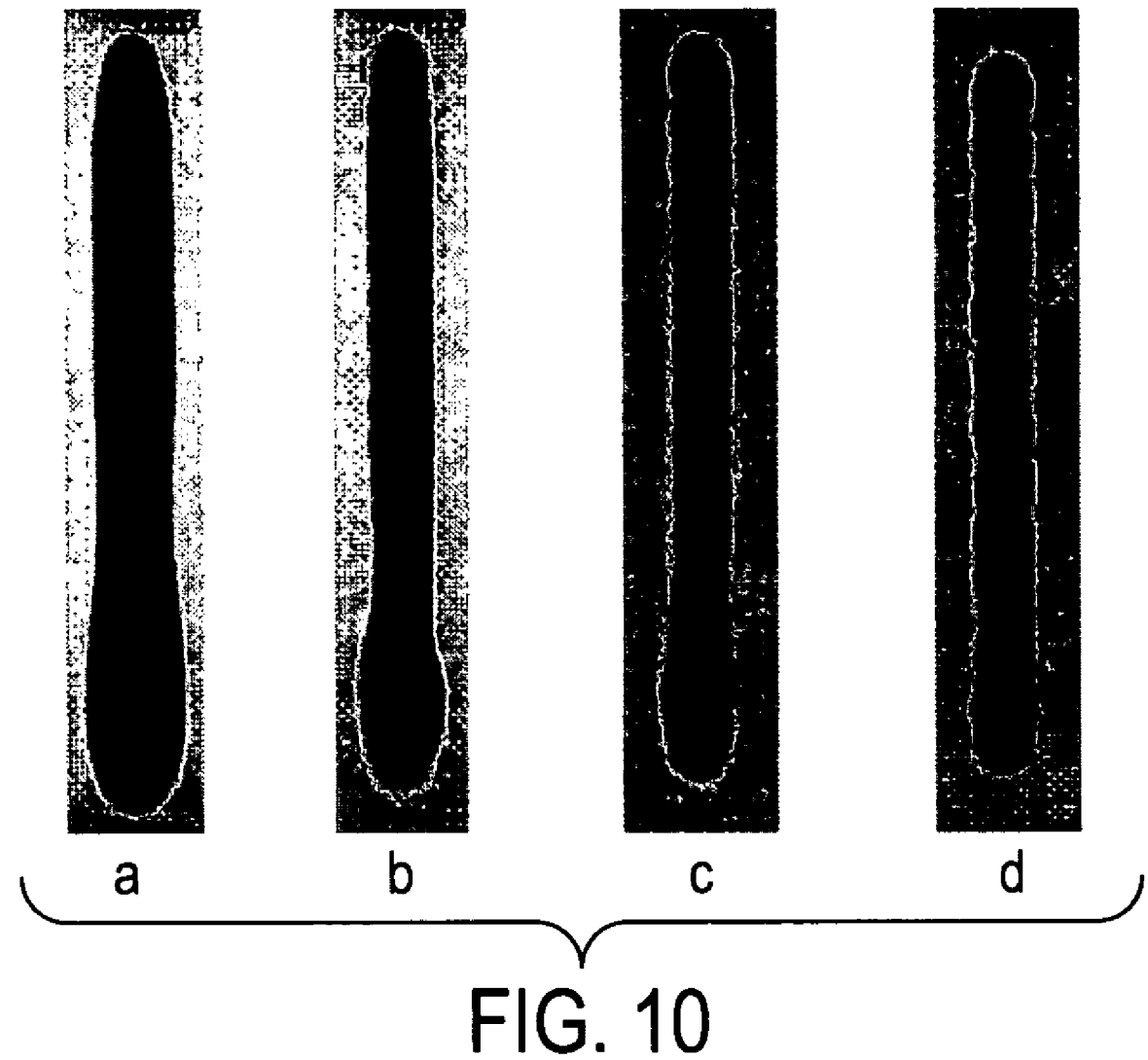
FIG. 10 shows lines that were printed at 2400 DPI by printing every (a) 3rd pixel, (b) 4th pixel, (c), 5th pixel, and (d) 6th pixel in the process direction.

Thus, it is possible to form lines by printing every nth pixel in the process direction. FIG. 10 shows lines that were printed at 2400 DPI by printing every (a) 3rd pixel, (b) 4th pixel, (c), 5th pixel, and (d) 6th pixel in the process direction.

It can be clearly seen that the optimum line width and edge smoothness are achieved when printing every 5th pixel in this example. The two adjacent drops should be placed at the optimum pitch to obtain smooth fine lines. At a pitch above this threshold, the lines are scalloped and below this threshold, the lines are wider. The roughness of the lines depends on the drop size and the pitch at which the adjacent drops are printed. It would be best to print at high addressability so that the drops may be placed at the accurate location such that smooth lines may be obtained without causing widening of the lines.

Print heads can produce uneven spot sizes that are reproducible. For example, the first drop fired from an ejector can be of different size than the rest of the drops. Also, the drops coalesce differently in the starting and ending of a line compared to the middle of the line. The starting and the ending of the lines do not have the same line width as the middle part of the line as can be observed in FIG. 10(a). In FIG. 10(d), the spacing between the adjacent pixels is larger and results in more uniform line endings. The printed pixel spacing can be varied in various regions such that the entire line is homogenous and optimal droplet coalescence is obtained.

This is an easy method to obtain smooth lines without increasing the line width substantially. The printed lines can be analyzed to see if the jet printed micro-scale lines are smooth and even.

In a multi-pass feature, the droplets deposited during sequential passes of the print head have solidified before any adjacent droplets from the next printing pass are deposited. Consequently the drops of print solution that make up the multi pass feature are not able to coalesce and therefore create scalloped feature borders. Methods have been proposed to print smooth-edged printed patterns by separating pattern layouts into discrete design layers that have only parallel layout features. By printing each design layer in a printing direction aligned with the parallel layout features, the individual print material droplets deposited onto the substrate are not solidified before adjacent droplets are deposited. This technique combined with the optimized pixel pitch may be used to print smooth lines in several different angles.

Varying width of the lines may be obtained by decreasing the printed pixel pitch. It should be noted that below the threshold pitch, lines are homogenous and smooth.

Figure 11:
FIG. 11 shows a printed line.
Figure 12:
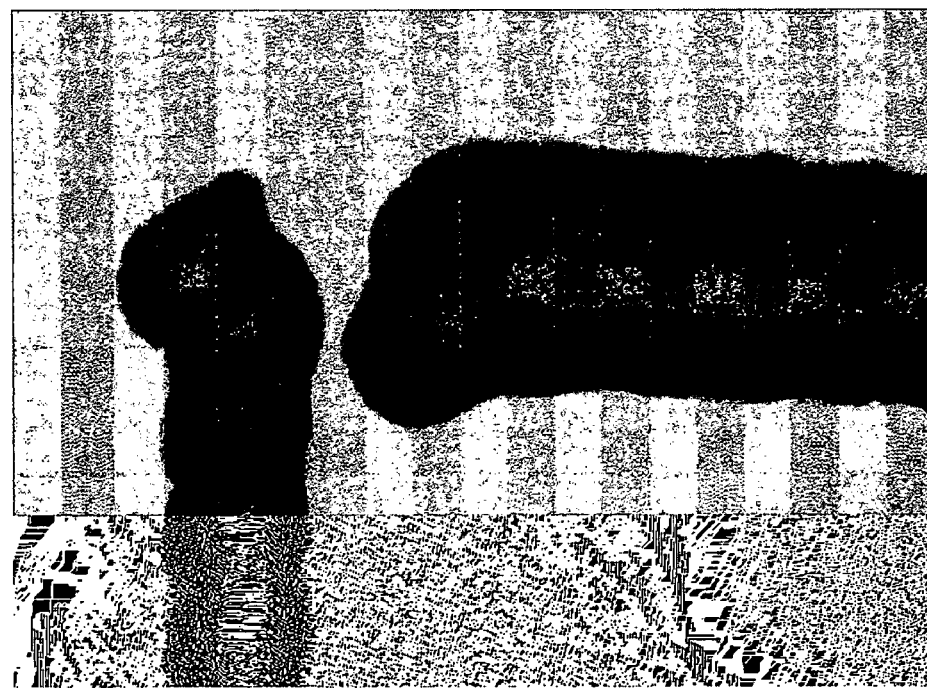
FIG. 12 shows the printed line of FIG. 11 after having been heated.

It should also be noted that multi-component waxes can have a range of melting points that are dependent on the individual component's melting point, with different melting points exhibiting a melting point range. For example, in the case of a multicomponent wax with a melting point range of 73 C to 100 C, line smoothing can be achieved in the temperature range 73 C to 100 C. At 90 C, the lower melting point components would change phase from a solid to a liquid. This controlled melting allows for only a small fraction of the wax to melt and flow. The flowing wax will improve the line smoothing. Thus, alternatively, the substrate 120 may be placed on a hotplate or other suitable heated fixture or device at a temperature and for a time sufficient enough to allow for line smoothing without completely melting the wax. FIG. 11 shows a printed line, and FIG. 12 shows the printed line after it has been heated at 90 degrees C. for 5 seconds.

It will be appreciated that various of the above-disclosed and other features and functions, or alternatives thereof, may be desirably combined into many other different systems or applications. Also that various presently unforeseen or unanticipated alternatives, modifications, variations or improvements therein may be subsequently made by those skilled in the art which are also intended to be encompassed by the following claims.

The invention claimed is:

1. A method of forming smooth micro-scale features with printed spots on a substrate using a printing system having a printing process direction and one or more print heads with one or more ejectors on each print head, the method comprising:
   determining the radius of the printed spots;
   creating a test pattern;
   printing the test pattern with the printing system; and
   analyzing the printed test pattern for drop spreading and smoothness of lines.

2. The method defined in claim 1, wherein the test pattern comprises successive patterns of spot features of varying spot placements demonstrating variations in spot placement pitch and adjacent drop timing.

3. The method defined in claim 2, wherein the test pattern is printed in the process direction.

4. The method defined in claim 2, wherein the test pattern is printed in the non-process direction.

5. The method defined in claim 1, wherein the printing system has multiple print heads with ejectors.

6. The method defined in claim 5, wherein the test pattern is printed by ejectors from different print heads.

7. The method defined in claim 1, wherein analyzing the printed test pattern further comprises for a known position of the test pattern:
   (a) calculating a figure of merit which describes the linewidths;
   (b) calculating a figure of merit which describes the roughness;
   (c) determining whether the optimal linewidth and roughness is achieved; and
   (d) post baking the substrate if the roughness is not acceptable.

8. The method defined in claim 7, wherein the linewidth figure of merit is the average, minimum and maximum of a line region.

9. The method defined in claim 7, wherein the roughness figure of merit is equal to the maximum linewidth minus the minimum linewidth of a line region.

10. The method defined in claim 1, wherein image components to be printed are oriented relative to the printing process direction to produce smooth micro-scale features.

11. A storage medium storing a set of program instructions executable on a data processing device and usable to form smooth micro-scale features with printed spots on a substrate using a printing system having a printing process direction and one or more print heads with one or more ejectors on each print head, the set of program instructions comprising:
   instructions for determining spot placement pitch and the radius of the printed spots;
   instructions for creating a test pattern;
   instructions for printing the test pattern with the printing system; and
   instructions for analyzing the printed test pattern for drop spreading and smoothness of lines.

12. The storage medium defined in claim 11, wherein the test pattern comprises successive patterns of spot features of varying spot placements demonstrating variations in spot placement pitch and adjacent drop timing.

13. The storage medium defined in claim 11, wherein the set of program instructions further comprises algorithms for the determination of test patterns for the determination of optimal spot placement to produce smooth line edge features and narrow linewidths.

14. The storage medium defined in claim 11, wherein the set of program instructions further comprises algorithms for the analysis of test patterns for the determination of optimal spot placement to produce smooth line edge features and narrow linewidths.

15. The storage medium defined in claim 11, wherein the printing system has multiple print heads.

16. The storage medium defined in claim 11, wherein the set of program instructions for analyzing the printed test pattern further comprises:
   (a) instructions for calculating the average, minimum and maximum linewidths;
   (b) instructions for calculating the roughness, where the roughness is equal to the maximum linewidth minus the minimum linewidth;
   (c) instructions for determining whether the optimal linewidth and roughness is achieved; and
   (d) instructions for post baking the substrate if the roughness is not acceptable.

17. The storage medium defined in claim 16, wherein the linewidth figure of merit is equal to the average, minimum and maximum of a line region.

18. The storage medium defined in claim 16, wherein the roughness figure of merit is equal to the maximum linewidth minus the minimum linewidth of a line region.

* * * * *